(12) United States Patent
Iwasaki

(10) Patent No.: US 7,262,626 B2
(45) Date of Patent: Aug. 28, 2007

(54) CONNECTION APPARATUS AND CABLE ASSEMBLY FOR SEMICONDUCTOR-DEVICE CHARACTERISTIC MEASUREMENT APPARATUS

(75) Inventor: Yukoh Iwasaki, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/437,362

(22) Filed: May 19, 2006

(65) Prior Publication Data
US 2006/0208756 A1    Sep. 21, 2006

Related U.S. Application Data

(63) Continuation of application No. 11/099,201, filed on Apr. 5, 2005, now Pat. No. 7,068,060.

(30) Foreign Application Priority Data

Apr. 7, 2004 (JP) .............................. 2004-113246
Mar. 29, 2005 (JP) .............................. 2005-93784

(51) Int. Cl.
*G01R 31/26* (2006.01)
*G01R 31/28* (2006.01)

(52) U.S. Cl. .................................. 324/765; 324/158.1

(58) Field of Classification Search ................ 324/765, 324/158.1
See application file for complete search history.

(56) References Cited

U.S. PATENT DOCUMENTS 7,078,927 B2 *  7/2006  Tanida et al. ................ 324/765
2004/0160231 A1 *  8/2004  Iwasaki et al. ............. 324/658

* cited by examiner

Primary Examiner—Ha Tran Nguyen
Assistant Examiner—Roberto Velez

(57) ABSTRACT

A connection apparatus includes a switch; a control signal connector that transmits a switching signal, sent from a controller, to the switching means; a first plurality of connectors that are connected to the switch and that are to be connected to a plurality of measurement connectors included in first measuring apparatus for measuring a first electrical characteristic of the device under test; and a second plurality of connectors that are connected to the switch and that are to be connected to a plurality of measurement connectors included in second measuring apparatus for measuring a second electrical characteristic of the device under test. In accordance with the switching signal sent from the controller via the control-signal connector, the switch performs switching so that either the first plurality of connectors or the second plurality of connectors are electrically connected to the device under test.

7 Claims, 8 Drawing Sheets

CONNECTION APPARATUS AND CABLE ASSEMBLY FOR SEMICONDUCTOR-DEVICE CHARACTERISTIC MEASUREMENT APPARATUS

CROSS-REFERENCE TO RELATED APPLICATION

The present application is a continuation of U.S. patent application Ser. No. 11/099,201, filed on Apr. 5, 2005 now U.S. Pat. No. 7,068,060.

BACKGROUND OF THE INVENTION

1. Field of the Invention

The present invention relates to an apparatus for integrally connecting a plurality of semiconductor-device characteristic measurement apparatuses having different connection schemes. In particular, the present invention relates to an apparatus that is connected to an electrical-characteristic measurement apparatus and switches the measurement apparatus for an integrated circuit device or a discrete electronic circuit device. For example, the present invention relates to an apparatus that appropriately switches between the capacitance measurement for layer-thickness evaluation and the measurement of gate leakage current for a MOS (metal oxide semiconductor) gate oxide layer, between the evaluation of inter-wire capacitance and the evaluation of inter-wire leakage, and between the evaluation of junction capacitance and that of IV (current-voltage) characteristics for bipolar transistors.

2. Description of the Related Art

Conventionally, a related technology shown in FIG. 1 is known as an apparatus for measuring electrical characteristics of devices to be tested (or hereinafter referred to as "devices under test" (DUT)), such as discrete electronic circuit devices and integrated circuit devices including semiconductors and so on.

FIG. 1 shows a known example of an apparatus for measuring an electrical characteristic or a voltage-current characteristic by using a probe device 100 to probe a DUT 10. Conventionally, one or more units into which a direct-current voltage source, a current source, a voltmeter, and an ammeter are integrated so as to be used in an arbitrary combination are connected to the DUT 10. Each unit is called a source monitor unit or a source measure unit (hereinafter referred to as an "SMU"), and a plurality of SMUs can be used in combination as, for example, an SMU 20. In the known example, a unit (i.e., a capacitance measure unit, and hereinafter referred to as a "CMU") 22 that can measure electrical capacitance is also used. For measurement using the SMU 20 and the CMU 22, such units are provided in an equipment rack 200 and manually connected to the probe apparatus 100, which probes specific electrical contacts and so on of the DUT 10, via a measurement cable (not shown). When a different characteristic of the DUT 10 is to be measured, an operator manually changes the wires between measuring apparatus for measuring the characteristic and the probe apparatus 100. In such a case, there is an advantage in that an appropriate wiring configuration can be used for each type of measurement. However, there is also a problem in that the measurement operation is inefficient, since the user needs to manually replace connections. Further, when the impedance of connection cables needs to be corrected to measure a capacitance, the measurement cannot be performed with high accuracy in some cases, since the impedance of the connection cables may depend on low the cables are bent. In addition, the SMU 20 and the CMU 22, which are measuring apparatus, should be connected in specific connection ways to the probe apparatus in order to realize accurate measurements. However, since the ways connections are made are generally complicated, the user needs to master them and a user who has not fully mastered them often mixes up connections.

SUMMARY OF THE INVENTION

An object of the present invention is to accurately measure electrical characteristics of a DUT without having to manually change the connection and without complicated connections. The present invention can be used for, but is not particularly limited to, a series of measurements, such as a case in which multiple measurement items and subjects are measured. Another object of the present invention is to improve the usability such that, when a user selects measurement subjects that he or she desires to evaluate, the necessary measuring apparatus is selected and a connection suitable for the measuring apparatus is established without distinguishing between types of measuring apparatus such as a SMU and a CMU.

The present invention provides a connection apparatus used for semiconductor-device characteristic measurement apparatuses. The connection apparatus includes a switch for being connected to a device under test, that receives a switching signal from a controller, the device under test being a semiconductor device; a control-signal connector for receiving the switching signal from the controller and sending the switching signal to the switch; a plurality of first connectors for being connected to the switch and for being connected to a plurality of first measuring apparatus connectors included in a first measuring apparatus for measuring a first electrical characteristic of the device under test; and a plurality of second connectors for being connected to the switch and for being connected to a plurality of second measuring apparatus connectors included in a second measuring apparatus for measuring a second electrical characteristic of the device under test. The first measuring apparatus and the second measuring apparatus are connected to the device under test via respective different wiring configurations. In response to the switching signal sent from the controller via the control-signal connector, the switch determines whether the device under test is electrically connected to the first or second connectors, in accordance with the wiring configuration of the corresponding measuring apparatus.

Since the switch is provided, the use of the connection apparatus allows measurement while switching between multiple measurement subjects under the control of the controller. In particular, when the plurality of measuring apparatus have respective different wiring configurations, switching the connections so as to correspond to the respective wiring configurations allows switching that does not impair the measurement accuracy of the measurement apparatus.

Preferably, the connection apparatus is connected to a measurement unit in which the first measuring apparatus, the second measuring apparatus, and the controller are arranged in a fixed relationship relative to each other, and the first measuring apparatus connectors, the second measuring apparatus connectors, and a control-signal output connector of the controller are arranged in a predetermined arrangement. The first connectors corresponding to the first measuring connectors, the second connectors corresponding to the second measuring apparatus connectors, and the control-signal connector corresponding to the control-signal output connector may be integrally arranged according to the predetermined arrangement. The connection apparatus may be integrally connectable to the first measuring apparatus connectors, the second measuring apparatus connectors, and the control-signal output connector.

Since the connection apparatus can be directly connected to the measurement unit, the complicated connection can be changed to a connection that appears simpler.

The first measuring apparatus may be a voltage-current characteristic measurement apparatus and the second measuring apparatus may be an electrical capacitance measurement apparatus.

The voltage-current characteristic measurement apparatus is, for example, a source monitor unit. Also, the electrical capacitance measurement apparatus is, for example, an LCR (inductance-capacitance-resistance) meter or an impedance meter. The voltage-current characteristic measurement apparatus measures a property of a device under test, mainly, using direct current. The electrical capacitance measurement apparatus measures a property of a device under test, mainly, using alternating current. With this connection apparatus, it is possible to measure an electrical property of the device without caring whether the electrical current is direct or alternating current.

The switch may include reconfiguring means, controlled by the controller, for changing a combination of measurement signals output to at least two terminals connected to the device under test.

For example, when measurement is performed across two electrodes of the device under test, there is a case in which it is desirable to reverse the combination of signals applied to the electrodes of the device under test. Even in such a case, when the reconfiguring means in the present invention is used, the controller allows a combination change, such as reversal of signals at the terminals, and can facilitate the change of the combination of the signals.

The semiconductor-device characteristic measurement apparatus may include inputting means, which has a first mode and a second mode, and a selection controller for receiving a selection input from the inputting means. The selection controller controls the first measuring apparatus, the second measuring apparatus, and the switch so that, upon the selection of the first mode, the first measuring apparatus is connected to the device under test and is operated, and upon the selection of the second mode, the second measuring apparatus is connected to the device under test and is operated. When the device under test is one of a metal-oxide-semiconductor transistor device, a pair of wires, and a bipolar transistor, measurement of corresponding one of gate leakage evaluation of a metal-oxide-semiconductor gate oxide layer, inter-wire leakage evaluation, and electrical characteristic evaluation of the bipolar transistor is selected in the first mode, and measurement of corresponding one of layer-thickness evaluation of the metal-oxide-semiconductor gate oxide layer, inter-wire capacitance evaluation, and junction capacitance evaluation of the bipolar transistor is selected in the second mode.

When the device under test is a MOS (metal oxide semiconductor), which is one type of field-effect transistor, leakage through the gate oxide layer can be measured by the source monitor unit. The layer thickness of the gate oxide layer can also be measured by measuring capacitance using the LCR meter. Thus, with the connection apparatus of the present invention, measuring the leakage and the layer thickness of the gate oxide layer of the MOS device facilitates evaluation work of the gate oxide layer. Also, when the device under test is a pair of wires, measuring the leakage and the inter-wire capacitance facilitates the evaluation of the wires. In addition, when the device under test is a bipolar transistor, evaluating an electrical characteristic, such as an IV (current-voltage) characteristic, and junction capacitance, which affects high-frequency characteristics, facilitates the evaluation of the bipolar transistor. With the inputting means in the present invention, selecting an intended evaluation item causes the required measuring apparatus to be automatically connected. Thus, the user does not have to select a connection that depends on each measuring apparatus, thereby simplifying the use.

The present invention further provides a cable assembly for relaying the measurement unit, which has the first measuring apparatus and the second measuring apparatus, and the above-described connection apparatus. In the measurement unit, the first measuring apparatus connectors and the second measuring apparatus connectors are arranged in a first arrangement. In the connection apparatus, the first connectors and the second connectors are arranged in a second arrangement. The cable assembly includes a first connector assembly, a second connector assembly, a plurality of conductor cables. The first connector assembly has a third connectors and a fourth connectors. The third connectors and the fourth connectors are arranged so as to correspond to the first arrangement to allow direct connection with the first measuring apparatus connectors and the second measuring apparatus connectors, respectively. The second connector assembly has a plurality of fifth connectors and a plurality of sixth connectors. The fifth connectors and the sixth connectors are arranged so as to correspond to the second arrangement to allow direct connection with the first connectors of the connection apparatus and the second connectors of the connection apparatus, respectively. The plurality of conductor cables relay the first connector assembly and the second connector assembly. The conductor cables include a first group of conductor lines that electrically connect the connectors of the third connectors to the corresponding connectors of the fifth connectors and a second group of conductor lines that electrically connect the connectors of the fourth connectors to the corresponding connectors of the sixth connectors.

The use of such a cable assembly simplifies the wiring from the measurement unit to the connection apparatus and allows the connection apparatus to be arranged in the vicinity of a device under test. Moreover, the cable assembly eliminates a need to connect the measurement unit using a separate cable and stabilizes the placement of the cable. Thus, it is possible to reduce a variation in the constant of a stray capacitance or the like of the cable.

The first connector assembly may further include a first control-signal relay connector. The second connector assembly may further include a second control-signal relay connector. The measurement unit may further include the control-signal output connector of the controller and the first arrangement includes the control-signal output connector. The connection apparatus may further include the control-signal connector and the second arrangement includes the control-signal connector. The first connector assembly includes the third connectors, the fourth connectors, and the first control-signal relay connector. The third connectors, the fourth connectors, and the first control-signal relay connector are arranged so as to correspond to the first arrangement to allow direct connection with the first measuring apparatus connectors, the second measuring apparatus connectors, and the control-signal output connector, respectively. The second connector assembly includes the fifth connectors, the sixth connectors, and the second control-signal relay connector. The fifth connectors, the sixth connectors, and the second control-signal relay connector are arranged so as to correspond to the second arrangement to allow direct connection with the first connectors, the second connectors, and the control-signal connector, respectively. The plurality of conductor cables further include a third group of conductor lines that electrically connect the first control-signal relay connector and the second control-signal relay connector.

Such an arrangement of the cable assembly allows a control signal to be transmitted along a wire for measurement, thereby making it possible to further simplify the connection.

With the connection apparatus of the present invention, when a characteristic of a device is measured, it is possible to reduce or automate work for switching between the first measuring apparatus and the second measuring apparatus. With the automated switching, the user can perform measurement without caring which of the first measuring apparatus and the second measuring apparatus is required for the characteristic he or she desires to measure.

The use of the cable assembly of the present invention makes it possible to reduce the number of cables used, thereby enhancing the convenience. Further, it is possible to perform measurement with a low error rate and to facilitate connections for measurement that uses a plurality of measuring apparatus.

DESCRIPTION OF THE PREFERRED EMBODIMENTS

Preferred embodiments according to the present invention will be described below with reference to the accompanying drawings.

Figure 1:
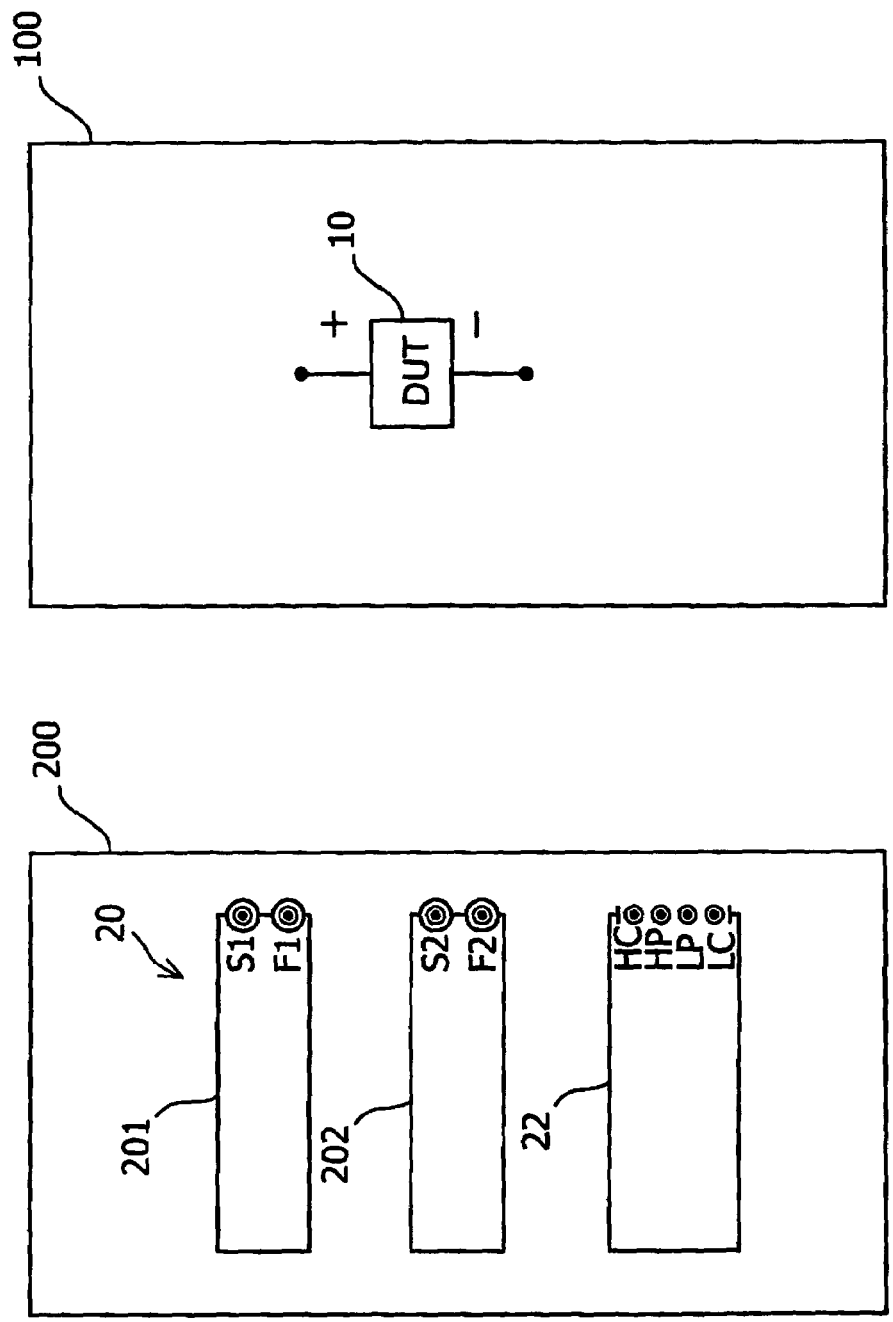
FIG. 1 is a diagram showing the configuration of a known semiconductor-device characteristic measurement unit and a device under test.
Figure 2:
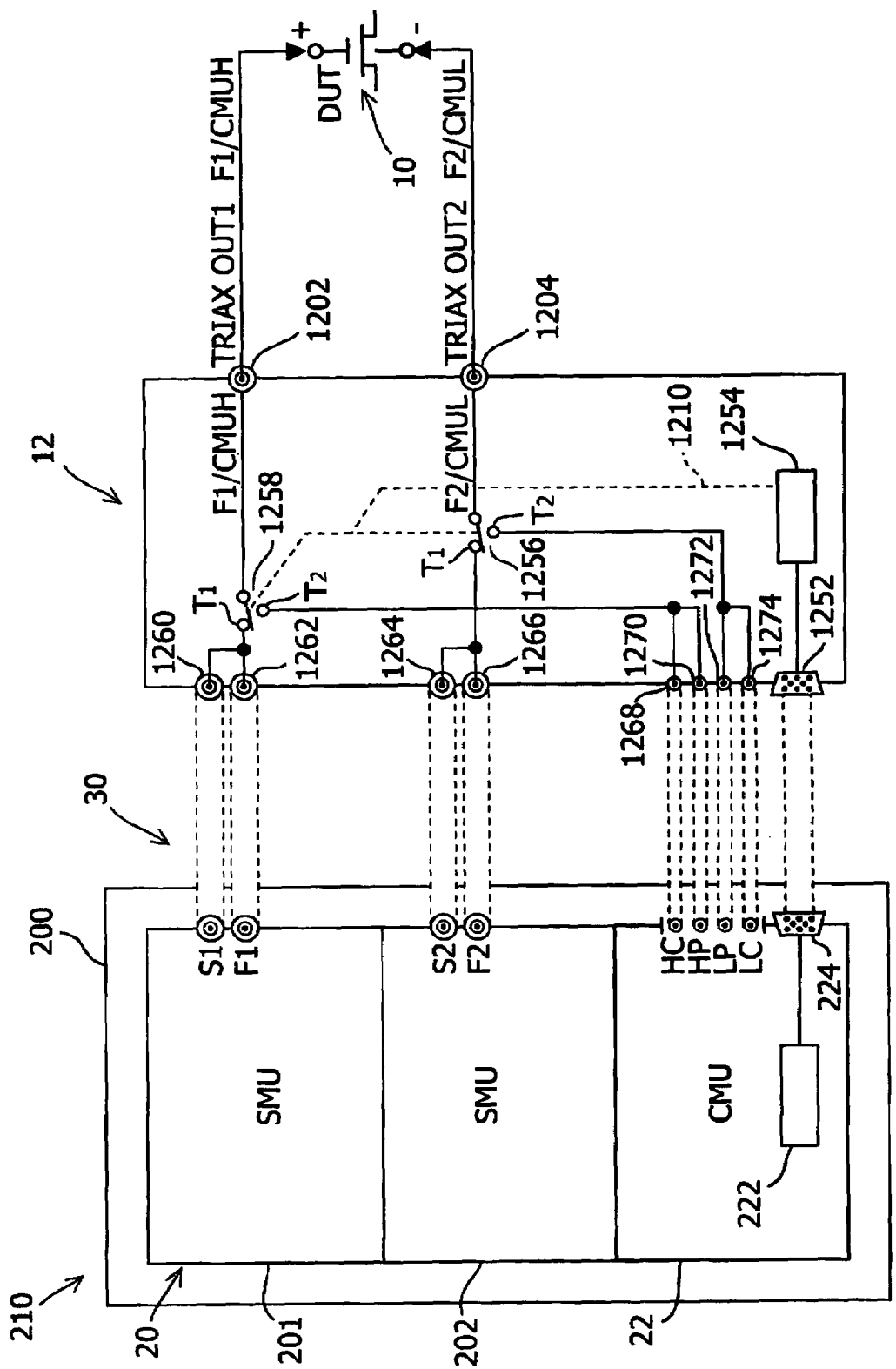
FIG. 2 is a diagram showing a connection scheme of a connection apparatus according to an embodiment of the present invention.

FIG. 2 is a block diagram showing an embodiment according to the present invention. In the embodiment, measurement is performed by switching between a DC (direct current) component of electrical characteristics of a DUT (device under test) 10 and the electrical capacitance of the DUT 10. For the measurement of the DC component, an SMU is used, and for the measurement of the electrical capacitance, a CMU is used. FIG. 2 illustrates a measurement unit 210, which is mounted on an equipment rack 200. The measurement unit 210 includes an SMU 20 (including SMUs 201 and 202: first measuring apparatus) and a CMU 22 (second measuring apparatus). The measurement unit 210 uses the measuring apparatus to measure the electrical characteristics of the DUT 10. Herein, for convenience, the terms "positive (+) side" and "negative (−) side" are used for terminals of the DUT 10 to distinguish between its connections with an apparatus. These expressions, however, are not particularly intended to mean their voltage potentials. A connection apparatus 12 is used between the measurement unit 210 and the DUT 10.

The SMUs 201 and 202 are measuring apparatus in which a DC voltage source, a current source, a voltmeter, and an ammeter are integrated and can be used in an arbitrary combination. The SMUs 201 and 202 can also be combined as the SMU 20 to perform measurement. In the SMU 20, the SMU 201 and the SMU 202 include triaxial-output force terminals F1 and F2 and triaxial-output sense terminals S1 and S2, respectively, so as to allow Kelvin connection. In each triaxial output, a center conductor transmits a signal, an outer shield conductor is connected to common, and a guard conductor disposed between the center conductor and the outer shield conductor transmits a guard signal having a potential maintained at the same potential as the signal in the center conductor.

The CMU 22 can typically measure impedance and can measure L (inductance), C (capacitance), and R (resistance) in various applied waveforms and under various conditions. That is, the CMU 22 is measuring apparatus that can serve as inductance measuring apparatus, capacitance measuring apparatus, and resistance measuring apparatus. The CMU 22 includes a controller 222 for controlling switches 1256 and 1258 of the connection apparatus 12. The controller 222 does not necessarily have to be included in the CMU 22. That is, any configuration is applicable if the controller 222 is provided in the measurement unit 210 or if the CMU 22 is made controllable by the measurement unit 210. The CMU 22 has a measurement connector HC for outputting positive (high) side current, a measurement connector HP for measuring a positive-side voltage, a measurement connector LC for outputting negative (low) side current, and a measurement connector LP for measuring a negative-side voltage. It is to be noted that the shield conductors of coaxial connectors HC, HP, LC and LP are insulated from the chassis ground of CMU 22.

The DUT 10 is, but is not limited to, a semiconductor device, such as a transistor, or a device of a TEG (tester element group) or the like fabricated on a silicon wafer and used for determining an optimum process condition for manufacturing integrated circuits. In addition, for example, a probe of a probe apparatus supplies signals to the positive-side and negative-side electrodes of the DUT 10 via connectors 1202 and 1204 for detecting responses from the electrodes.

The connectors 1202 and 1204 are provided at the connection apparatus 12. The connector 1202 is a triaxial output connector used for connection to the positive side of the DUT 10 and the connector 1204 is a triaxial output connector used for connection to the negative side of the DUT 10.

The measurement unit 210 and the connection apparatus 12 are connected in the manner indicated by connection 30.

This connection can be achieved by directly interconnecting the measurement unit 210 and the connection apparatus 12 in the present invention. Alternatively, the connection can be achieved by using a cable assembly that relays the measurement unit 210 and the connection apparatus 12. Next, a scheme for such connections will be described in further detail.

The switches 1256 and 1258 are connected to a plurality of connectors 1260, 1262, 1264, and 1266 (a first plurality of connectors), which are adapted to be connected to the plurality of measurement connectors S1, F1, S2, and F2 of the SMU 20. The switches 1256 and 1258 are also connected to a plurality of connectors 1268, 1270, 1272, and 1274 (a second plurality of connectors), which are adapted to be connected to the plurality of measurement connectors HC, HP, LP, and LC of the CMU 22.

In accordance with a switching signal supplied from the controller 222, the switches 1256 and 1258 switch the electrical connections for the DUT 10 between the first plurality of connectors 1260 to 1266 and the second plurality of connectors 1268 to 1274.

The connection apparatus 12 has a control-signal connector 1252. Upon receiving the switching signal via the control-signal connector 1252, switch driving means 1254 makes the switches 1256 and 1258 (i.e., switching means) operate. The switches 1258 and 1256 are operated in conjunction with each other. Thus, when the switch 1258 selects a terminal T1, the switch 1256 also selects a terminal T1, and when the switch 1258 selects a terminal T2, the switch 1256 also selects a terminal T2. In this manner, by using the switch 1258 and the switch 1256, the connection apparatus 12 changes the unit used for measuring the DUT 10 between the SMU 20 and the CMU 22.

Figure 3:
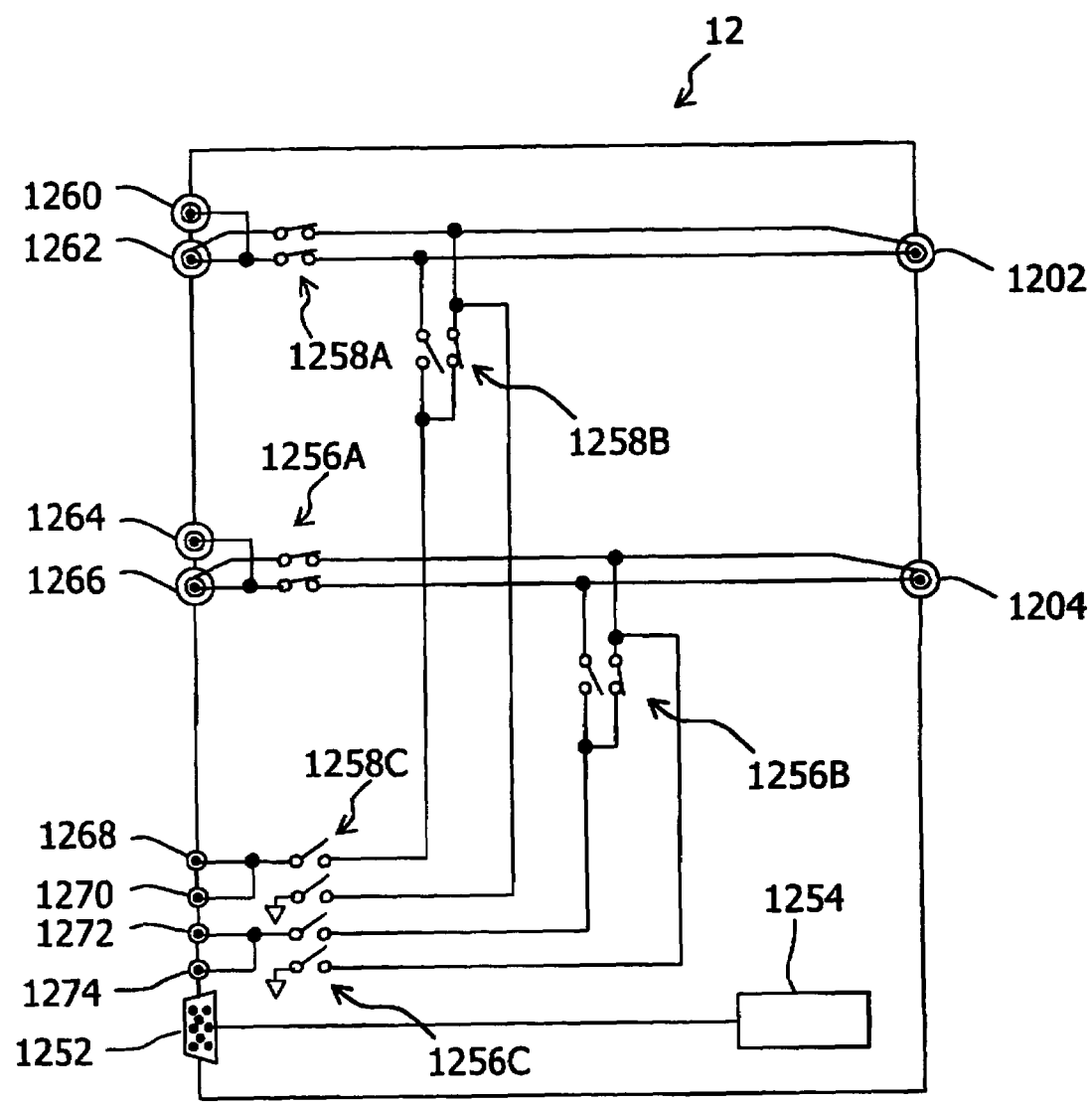
FIG. 3 is a diagram showing the internal structure of the connection apparatus according to the embodiment of the present invention.

Details of the connection apparatus 12 will be described with reference to FIG. 3. The connectors 1202, 1204, and 1260 to 1266 are triaxial connectors, the connectors 1268 to 1274 are coaxial connectors such as BNC (Bayonet Neill-Concelman) connectors, and the connector 1252 is a digital-signal connector such as a D-sub connector. Switches 1258A, 1258B, and 1258C are switches for implementing the operation of the switch 1258 shown in FIG. 2. The reason why the switch 1258 is divided into the three switches is to reduce leakage current, stray capacitance, and so on in the connection apparatus 12. Similarly, switches 1256A, 1256B, and 1256C are switches for implementing the operation of the switch 1256 shown in FIG. 2.

The center conductor of the connector 1260 is a signal line connected to the center conductor of the connector S1 of the SMU 201. The center conductor line of the connector 1260 is also connected to the center conductor of the connector 1262. This connection point serves as a voltage measurement point for Kelvin connection.

The center conductor of the connector 1262 is a signal line connected to the center conductor of the connector F1 of the SMU 201. After being connected to the center conductor line of the connector 1260, the center conductor line of the connector 1262 is connected to the center conductor of the connector 1202 via the switch 1258A.

The guard conductor of the connector 1262 is a guard line connected to the guard conductor of the connector F1 of the SMU 201. The guard conductor line of the connector 1262 is connected to the guard conductor of the connector 1202 via the switch 1258A.

The center conductor of the connector 1264 is a signal line connected to the center conductor of the connector S2 of the SMU 202. The center conductor line of the connector 1264 is connected to the center conductor of the connector 1266. This connection point serves as a voltage measurement point for Kelvin connection.

The center conductor of the connector 1266 is a signal line connected to the center conductor of the connector F2 of the SMU 202. After being connected to the center conductor line of the connector 1264, the center conductor line of the connector 1266 is connected to the center conductor of the connector 1204 via the switch 1256A.

The guard conductor of the connector 1266 is a guard line connected to the guard conductor of the connector F2 of the SMU 202. The guard conductor line of the connector 1266 is connected to the guard conductor of the connector 1204 via the switch 1256A.

The center conductor of the connector 1268 is connected to the center conductor of the connector HC of the CMU 22. The center conductor line of the connector 1268 is connected to the center conductor line of the connector 1202 via the switches 1258C and 1258B, and the guard conductor of the connector 1202 is connected to a common line by the switch 1258C.

The center conductor of the connector 1270 is connected to the center conductor of the connector HP of the CMU 22. The center conductor line of the connector 1270 is connected to the center conductor line of the connector 1268.

The center conductor of the connector 1272 is connected to the center conductor of the connector LP of the CMU 22. The center conductor line of the connector 1272 is connected to the center conductor line of the connector 1204 via the switches 1256C and 1256B, and the guard conductor of the connector 1204 is connected to a common line by the switch 1256C.

The center conductor of the connector 1274 is connected to the center conductor of the connector LC of the CMU 22. The center conductor line of the connector 1274 is connected to the center conductor line of the connector 1272.

The guard conductor line of the connector 1202 is selectively connected by the switch 1258C to a common line via the switch 1258B. Similarly, the guard conductor line of the connector 1204 is selectively connected to a common line by the switch 1256C via the switch 1256B.

The connector 1252 is connected to the switch driving means 1254. The controller 222 sends an appropriate switching signal to the switch driving means 1254, depending on which of the SMU 20 and the CMU 22 the user of the measurement unit 210 selects to perform measurement. Each switch is driven by a drive signal (not shown) supplied from the switch driving means 1254. In this case, the switch driving means 1254 controls each switch in the following manner.

When the SMU 20 performs measurement, the switches 1258A to 1258C and 1256A to 1256C are in the states illustrated. That is, the switches 1258A and 1256A are closed and the switches 1258C and the switch 1256C are opened. Further, the switch 1258B is in a state such that the line that links the switch 1258B and the switch 1258C is connected to the guard conductor of the connector 1202, and the switch 1256B is in a state such that the line that links the switch 1256B and the switch 1256C is connected to the guard conductor of the connector 1204.

When the CMU 22 performs measurement, the states of the switches 1258A to 1258C and 1256A to 1256C are opposite to the states illustrated. That is, the switch 1258A and the switch 1256A are opened and the switch 1258C and the switch 1256C are closed. Further, the switch 1258B is put into a state such that the guard conductor of the connector 1202 is connected to a common line and the center conductor of the connector 1202 is connected to the center conductors of the connectors 1268 and 1270. The switch 1256B is put into a state such that the guard conductor of the connector 1204 is connected to a common line and the center conductor of the connector 1204 is connected to the center conductors of the connectors 1272 and 1274.

Figure 4:
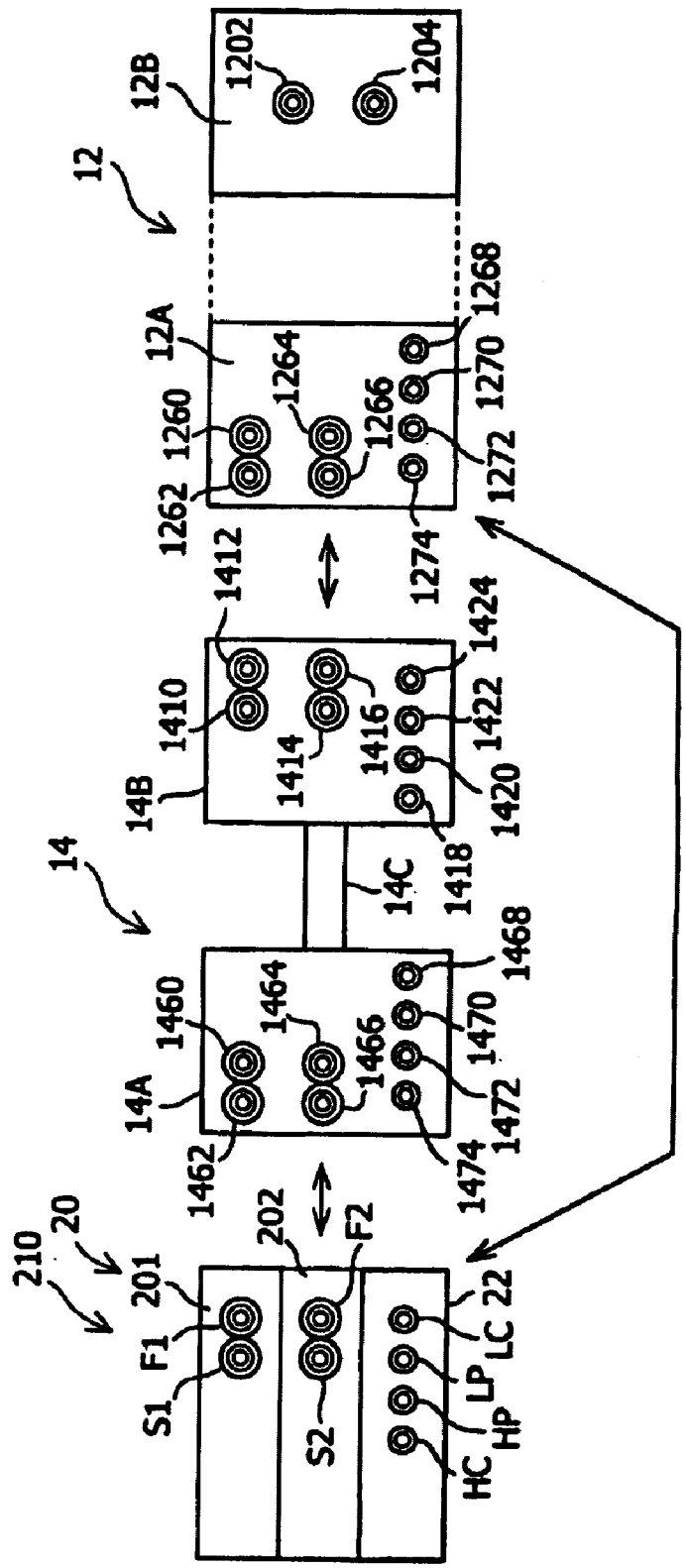
FIG. 4 is a diagram showing the configuration of the connection apparatus according to the embodiment of the present invention and connectors of a cable assembly.

FIG. 4 shows an example of a connector in the embodiment of the present invention. For ease of understanding, a control-signal output connector 224 (shown in FIG. 2), the control-signal connector 1252, the controller 222, and so on are not illustrated in FIG. 4. In practice, however, the control signal output connector 224 and the controller 222 are included in the measurement unit 210 or can be controlled through the measurement unit 210, and the control-signal connector 1252 is also included in the connection apparatus 12. In the measurement unit 210, the positional relationships among the SMUs 201 and 202 and the CMU 22 are fixed relative to each other. As a result, the measurement connectors S1, F1, S2, F2, HC, HP, LP, and LC are arranged in a certain arrangement.

The connection apparatus 12 has a first surface 12A and a second surface 12B. The connectors 1260 to 1274 are arranged on and integrated with the surface 12A so as to correspond to the arrangement of the measurement connectors of the measurement unit 210. The connectors 1260 to 1274 arranged on the surface 12A are opposed to and directly fitted with the corresponding measurement connectors S1, F1, S2, F2, HC, HP, LP, and LC, so that the connection 30 shown in FIG. 2 is established by a single connection operation. The connectors 1202 and 1204 are arranged on the surface 12B of the connection apparatus 12 and are connected to the probe apparatus (FIG. 2) through triaxial cables.

A case in which the measurement unit 210 and the connection apparatus 12 are connected using an integrated cable assembly 14 will now be described. The cable assembly 14 is constituted by two connector assemblies 14A and 14B and a cable assembly 14C.

The connector assembly 14A has connectors 1460, 1462, 1464, 1466, 1468, 1470, 1472, and 1474 that are arranged so as to correspond to the arrangement (a first arrangement) of the measurement connectors S1, F1, S2, and F2 and the connectors HC, HP, LP, and LC of the measurement unit 210. The connectors 1460, 1462, 1464, 1466, 1468, 1470, 1472, and 1474 are integrally arranged so as to allow direct connection with the connectors S1, F1, S2, and F2 and the connectors HC, HP, LP, and LC, respectively.

The connector assembly 14B has connectors 1410, 1412, 1414, 1416, 1418, 1420, 1422, and 1424 that are arranged so as to correspond to the arrangement (a second arrangement) of the connectors 1260, 1262, 1264, 1266, 1268, 1270, 1272, and 1274 of the connection apparatus 12. The connectors 1410 to 1424 are integrally arranged so as to allow direct connection with the connectors 1260 to 1274, respectively.

The cable assembly 14C has a structure in which cables that connect the connectors 1460 to 1474 with the corresponding connectors 1410 to 1424 are bundled. Each cable is a triaxial cable or a coaxial cable, as indicated by the connection 30 shown in FIG. 2. When relay connectors (not shown) for the control signal are provided in the connector cable assemblies 14A and 14B, a control cable for transmitting the control signal can be included in the cable assembly 14C. Since the connection cables are bundled, the cable assembly 14 can prevent correction failure caused by a connection-impedance fluctuation due to cable bending, even when the impedances of the connection cables are corrected for capacitance measurement.

In FIG. 4, the arrangement (i.e., the second arrangement) of the connectors 1260 to 1274 of the connection apparatus 12 is the mirror-image of the arrangement (the first arrangement) of the measurement connectors S1, F1, S2, and F2 and the connectors HC, HP, LP, and LC of the measurement unit 210. Such an arrangement, however, is not necessarily required for use of the cable assembly 14. As shown in FIG. 4, arrangement of the connectors in the mirror-image configurations having the same sizes such that the connectors are appropriately fitted with each other provides an advantage in that the user can appropriately select whether to use the cable assembly 14 or not. Moreover, those connectors do not have to be arranged in mirror-image configurations. In such a case, for example, the connectors of the connector assembly 14B and the connectors at the surface 12A of the connection apparatus 12 are arranged in a mirror-image configuration having the same size so as to allow appropriate mating of the connectors. This makes it possible to fabricate the connection apparatus 12 and the connector assembly 14B in various sizes and arrangements. In addition, including the signal lines and the connectors and for the control signal in the cable assembly further facilitates the connections.

Figure 5:
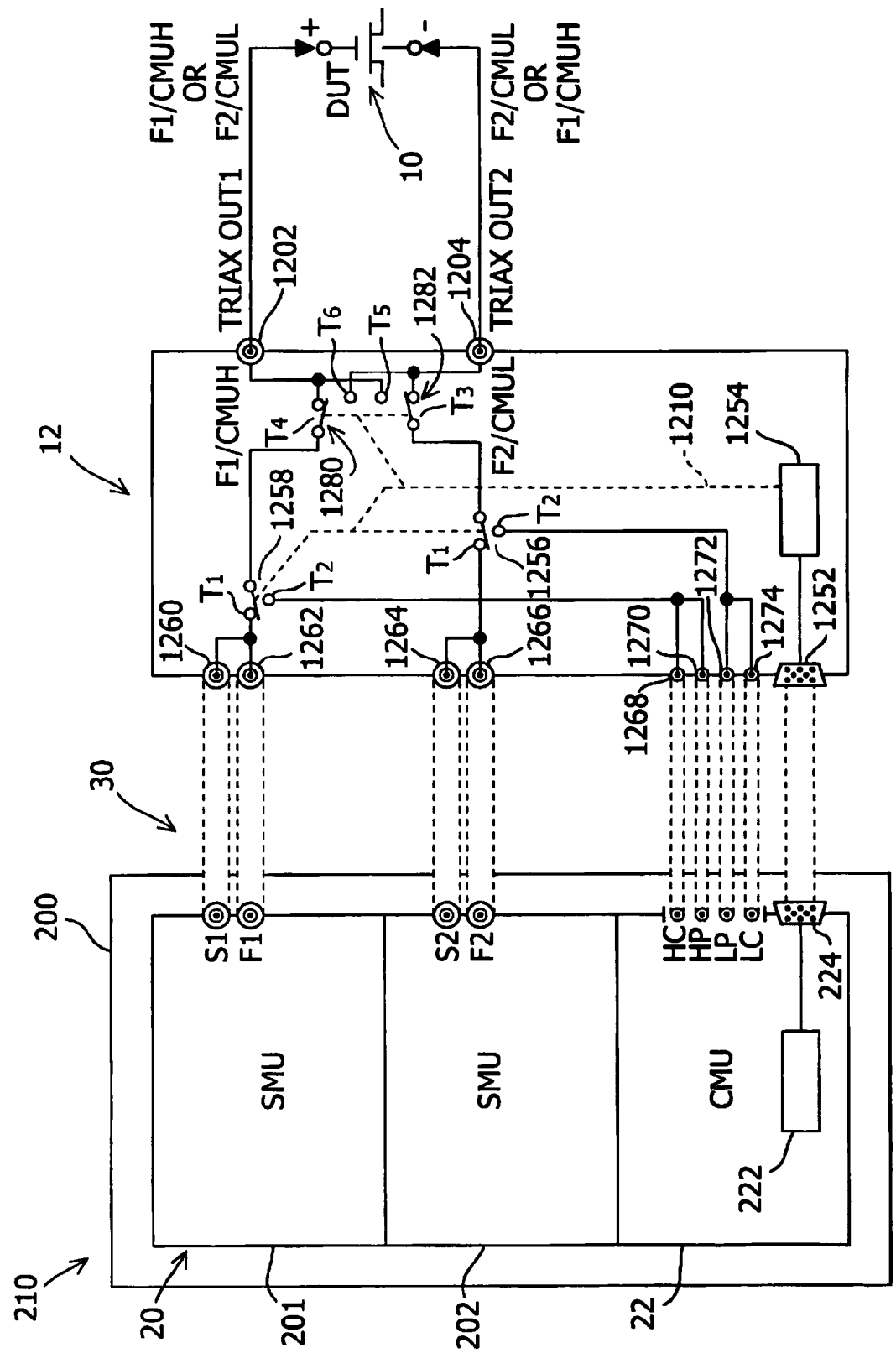
FIG. 5 is a diagram showing a connection scheme of the connection apparatus according to the embodiment of the present invention, the connection apparatus having reconfiguring means.

A configuration in which the combination of terminals connected to the DUT 10 can be reconfigured will now be described with reference to FIG. 5. A switch 1280 and a switch 1282 serve as reconfiguring means in the present invention and are used for reconfiguring the combination of measurement terminals to be connected to the positive side and negative side of the DUT 10. The switches 1280 and 1282 are driven by the switch driving means 1254 that receives a signal from the controller 222. The switches 1280 and the 1282 are controlled in conjunction with each other such that, for example, when the switch 1280 selects a terminal T4, the switch 1282 selects a terminal T3, and when the switch 1280 selects a terminal T6, the switch 1282 selects a terminal T5. As a result, for example, when the SMU 20 performs measurement, the connection can be such that the terminal F1 of the SMU 201 is connected to the positive side of the DUT 10 and the terminal F2 of the SMU 202 is connected to the negative side of the DUT 10 or, conversely, such that the terminal F2 of the SMU 202 is connected to the positive side of the DUT 10 and the terminal F1 of the SMU 201 is connected to the negative side of the DUT 10. Reconfiguring the combination of signals, as described above, allows flexible changes of connections between the measurement connectors and the corresponding terminals of the DUT 10 so as to correspond to a desired measurement target of the DUT 10.

Although a combination of two terminals has been described hereinabove, the DUT may have three or more terminals. In such a case, it is also effective to provide a matrix switch that allows more flexible reconfiguration of the combination of outputs for the terminals.

Figure 6:
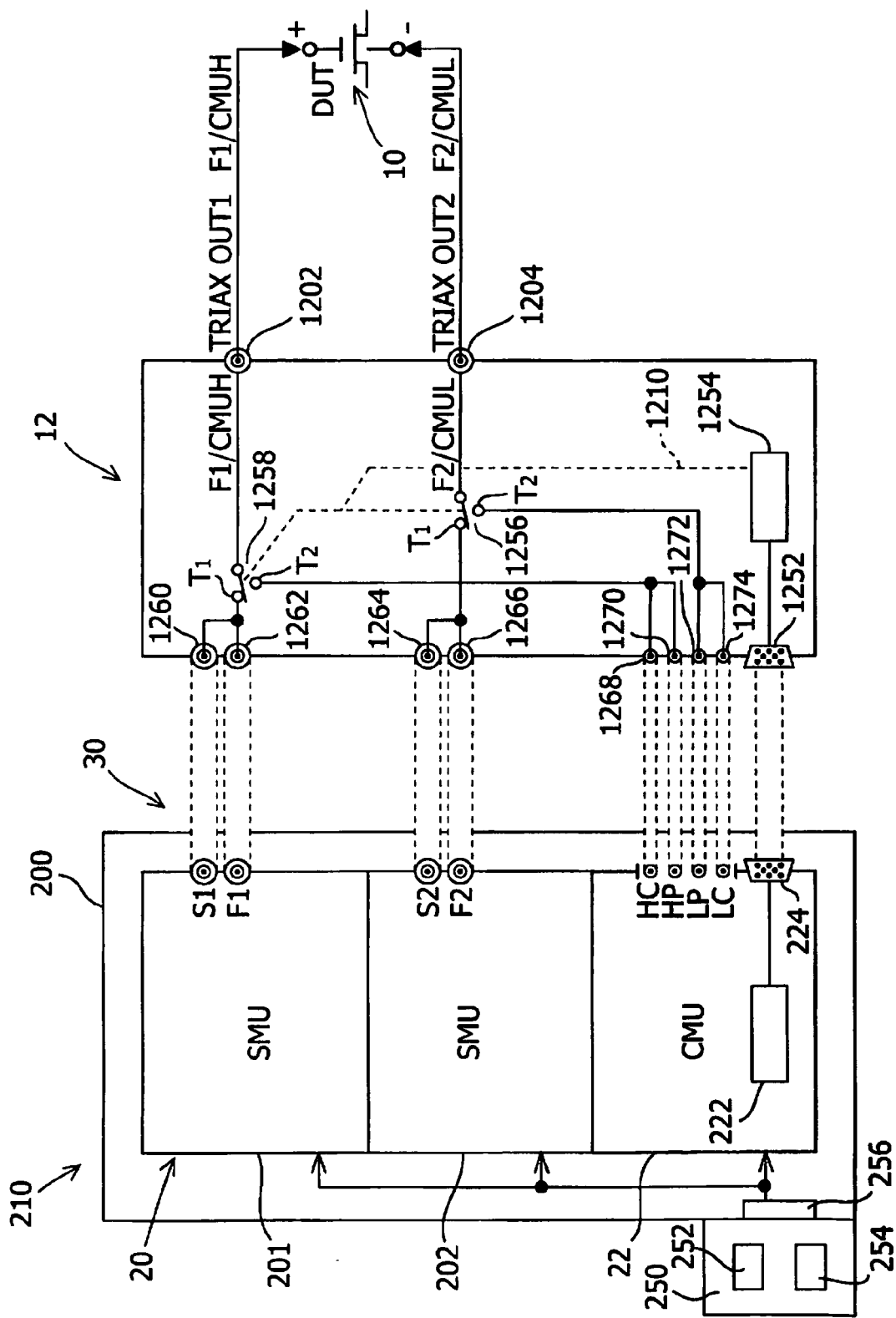
FIG. 6 is a diagram showing the configuration of the connection apparatus according to the embodiment of the present invention, the connection apparatus having inputting means.

A configuration in which an input apparatus 250 having two modes is used to switch measurement when the DUT 10 is any of a MOS transistor device, a pair of wires, and a bipolar transistor will now be described with reference to FIG. 6. The input apparatus 250 has a first mode for a case in which a button 252 is selected and a second mode for a case in which a button 254 is selected. In this case, the two modes are mutually exclusive. The user inputs a selection to the input apparatus 250 and the selection input is input to a controller 256 (selection controller). When the button 252 is selected, the controller 256 controls the SMUs 201 and 202 so that they perform measurement and controls the CMU 22 so that the controller 222 in the CMU 22 controls the switches of the connection apparatus 12. As a result, an output from the measurement connector F1 of the SMU 201 is transmitted to the positive side of the DUT 10 and, furthermore, an output from the measurement connector F2 of the SMU 202 is output to the negative side of the DUT 10. When the button 254 is selected, the controller 256 controls the CMU 22 so that the CMU 22 performs measurement and causes the controller 222 in the CMU 22 to control the switches of the connection apparatus 12. As a result, outputs (illustrated as CMUH) from the measurement connectors HC and HP of the CMU 22 are transmitted to the positive side of the DUT 10 and, furthermore, outputs (illustrated as CMUL) from the measurement connectors LC and LP of the CMU 22 are transmitted to the negative side of the DUT 10.

With this arrangement, when the DUT 10 is a MOS transistor device, the user can appropriately select or switch connections and measurements suitable for or required for the evaluation simply by switching the input apparatus 250, where the connections and the measurements are switched for gate leakage evaluation of a MOS gate oxide layer through the use of the SMU 20 or for layer thickness evaluation of the MOS gate oxide layer through the use of the CMU 22. When the DUT 10 is a pair of wires, the user can appropriately select or switch connections and measurements suitable for or required for the evaluation simply by switching the input apparatus 250, where the connections and measurements are switched for inter-wire leakage evaluation through the use of the SMU 20 or for inter-wire capacitance evaluation through the use of the CMU 22. When the DUT 10 is a bipolar transistor, the user can select or switch connections and measurements suitable for or required for the evaluation simply by switching the input apparatus 250, where the connections and measurements are switched for electrical characteristic evaluation through the use of the SMU 20 or for junction capacitance evaluation through the use of the CMU 22.

Figure 7:
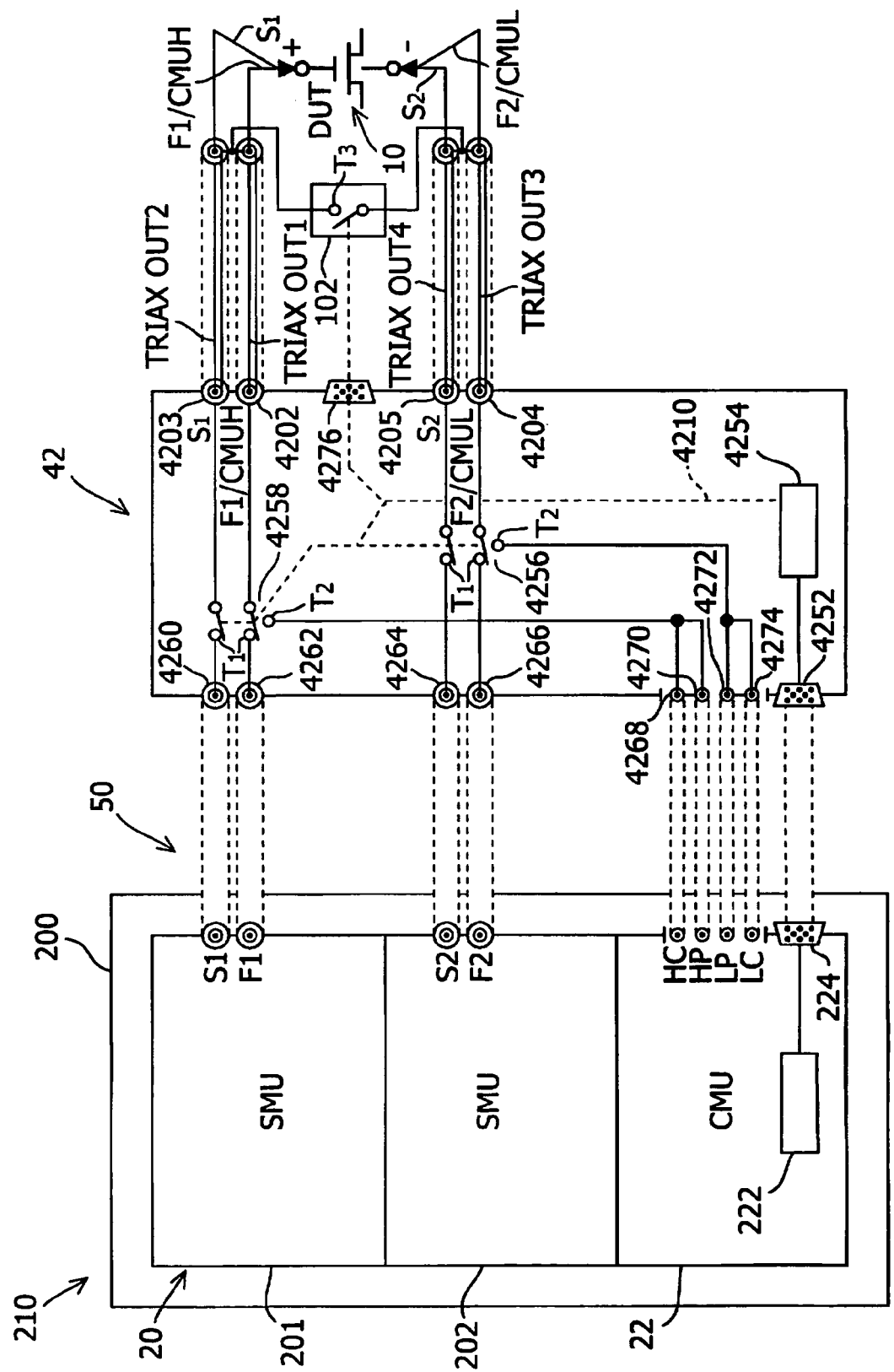
FIG. 7 is a diagram showing a connection scheme of a connection apparatus according to an alternative embodiment of the present invention.
Figure 8:
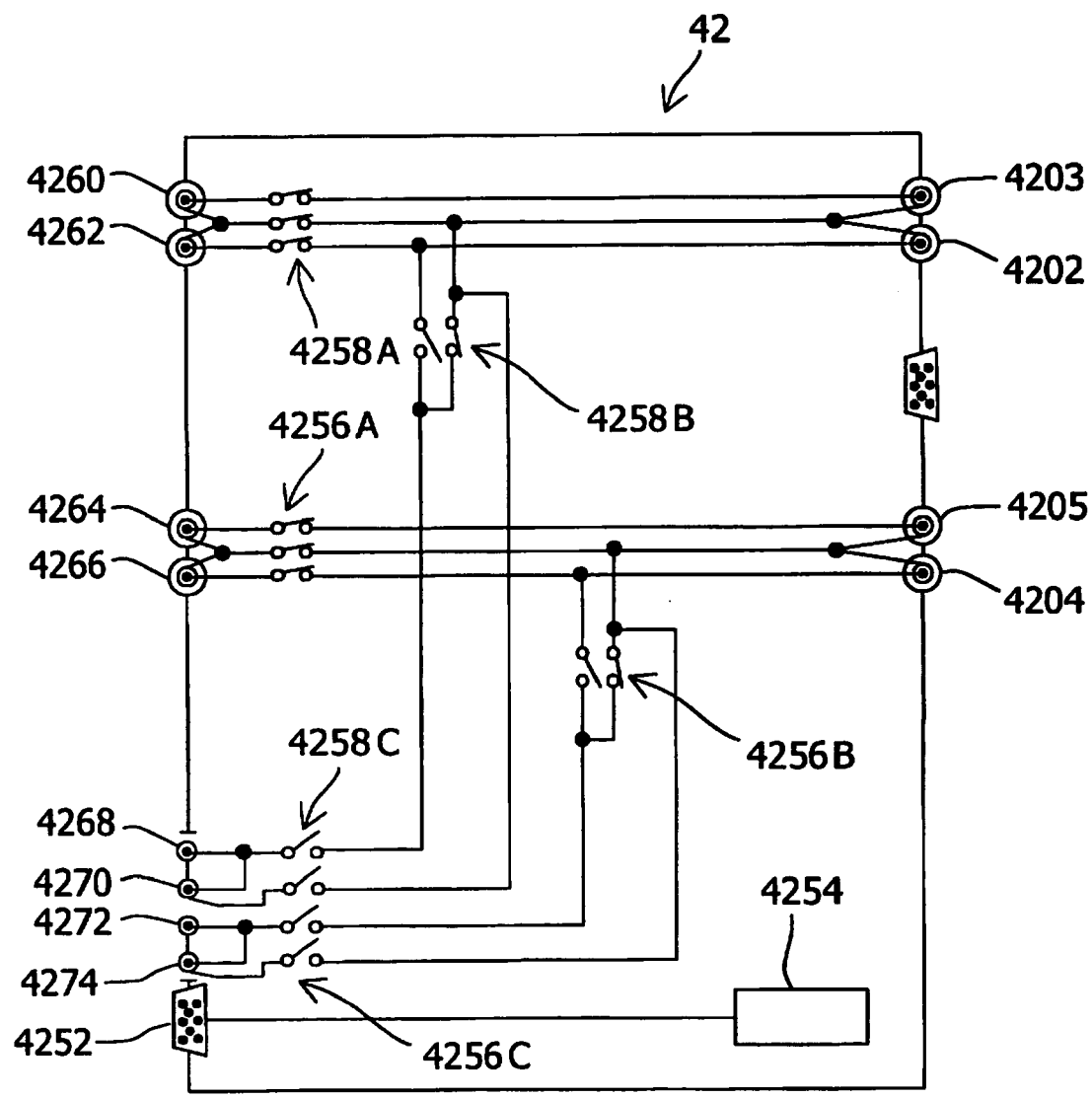
FIG. 8 is a diagram showing the internal structure of the connection apparatus according to the alternative embodiment of the present invention.

The configuration of an improved version of the connection apparatus shown in FIGS. 2 and 3 will be described next with reference to FIGS. 7 and 8. FIG. 7 is a diagram showing a connection state when a connection apparatus 42 having a configuration that is improved over the connection apparatus shown in FIG. 2 is used. As in the case shown in FIG. 2, measurements in this embodiment are also performed by switching between the SMU for measuring the DC components of electrical characteristics of the DUT 10 and the CMU for measuring the electrical capacitance of the DUT 10. The connection apparatus 42 is used between the measurement unit 210 and the DUT 10.

One object of the improved connection apparatus 42 is to maintain Kelvin connection to the terminals of the DUT 10 by providing force terminals and sense terminals at the DUT side of the connection apparatus 42. With this arrangement, higher accuracy measurement can be achieved when the SMU 20 performs DC measurement in the present invention. As shown in FIG. 7, connectors 4260 to 4274 and connector 4252 are provided at the measurement-unit side of the connection apparatus 42, in the same manner as the connectors 1260 to 1274 and the connector 1252(FIG. 2) provided at the connection apparatus 12. In contrast, at the DUT side of the connection apparatus 42, two additional triaxial connectors are provided in addition to the configuration of the connection apparatus 12 that uses the connectors 1202 and 1204 shown in FIG. 2. Thus, in the connection apparatus 42, connectors 4202 and 4203 are used for connection at the positive side of the DUT 10; and connectors 4204 and 4205 are used for connection at the negative side of the DUT 10. Furthermore, inside the connection apparatus 42, switches 4258 and 4256 are provided and switch driving means 4254 for driving the switches 4258 and 4256 is also provided. The switch driving means 4254 is controlled in accordance with a control signal transmitted from the controller 222 via the connectors 224 and 4252.

Another object of the improved connection apparatus 42 is to directly connect, in the connection with the CMU 22, the ground line of the CMU 22 to the DUT 10 by insulating the ground line in the connection apparatus 42. To achieve this object, a guard switch 102 is additionally provided in the vicinity of the DUT 10. A connector 4276 is provided at the DUT side of the connection apparatus 42 in order to control the guard switch 102. An output from the switch driving means 4254 is extracted to the connector 4276 to control the guard switch 102.

As shown in FIG. 7, similarly to the case of the connection apparatus 12 in FIG. 2, the measurement unit 210 and the connection apparatus 42 are connected in the manner indicated by connection 50. This connection 50 can be achieved by directly interconnecting the measurement unit 210 and the connection apparatus 42 or can be achieved by using a cable assembly that connects the measurement unit 210 and the connection apparatus 42.

The configuration of the improved connection apparatus 42 will further be described with reference to FIG. 8. Switches 4258A, 4258B and 4258C are switches for implementing the operation of the switch 4258 shown in FIG. 7. The reason why the switch 4258 is divided into the three switches is to reduce leakage current, stray capacitance, and so on in the connection apparatus 42. Similarly, switches 4256A, 4256B and 4256C are switches for implementing the operation of the switch 4256 shown in FIG. 7.

The guard conductors of the connectors 4260 and 4262 are interconnected and are connected to the guard conductors of the connectors 4202 and 4203 via the switch 4258A.

The center conductor of the connector 4260 is a signal line connected to the center conductor of the connector S1 of the SMU 201. The center conductor line of the connector 4260 is connected to the center conductor of the connector 4203 via the switch 4258A. This realizes a connection similar to the triaxial cable so as to connect the triaxial connectors 4260 and 4203 in the connection apparatus 42.

Furthermore, the center conductor of the connector 4262 is a signal line connected to the center conductor of the connector F1 of the SMU 201. The center conductor line of the connector 4262 is connected to the center conductor of the connector 4202 via the switch 4258A. In this manner, the triaxial connectors 4262 and 4202 are connected in the connection apparatus 42 so as to realize a connection similar to the triaxial cable.

In the same manner, with regard to the connector 4264 and the connector 4266, the triaxial connectors 4264 and 4205 are interconnected and the triaxial connectors 4266 and 4204 are interconnected via the switch 4256A so as to realize a connection similar to the triaxial cable.

Inside the connection apparatus 42, the connectors 4268 to 4274 are connected to the connectors 4202 to 4205. Unlike the case of the connection apparatus 12 shown in FIG. 3, the shield conductors of the connectors 4268 to 4274 of the connection apparatus 42 are electrically insulated from the ground line and chassis ground of the connection apparatus 42.

The center conductor line of the connector 4268 is connected to the center conductor line of the connector 4202 via the switches 4258C and 4258B. The center conductor line of the connector 4270 is also connected to the center conductor line of the connector 4268. The shield conductor of the connectors 4268 and 4270 are connected to the guard conductors of the connectors 4202 and 4203 via the switch 4258C. As described above, the shield conductors of the connectors 4268 and 4270 are insulated from the ground line and chassis ground of the connection apparatus 42.

The center conductor line of the connector 4272 is connected to the center conductor line of the connector 4204 via the switches 4256C and 4256B. The center conductor line of the connector 4274 is also connected to the center conductor line of the connector 4272. The shield conductors of the connectors 4272 and 4274 are connected to the guard conductors of the connectors 4204 and 4205 via the switch 4256C. As described above, the shield conductors of the connectors 4272 and 4274 are insulated from the ground line and chassis ground of the connection apparatus 42.

The connector 4252 is connected to the switch driving means 4254. The controller 222 is connected to the switch driving means 4254 via the connector 224. When the user selects measurement using the SMU 20 or measurement using the CMU 22 at the measurement unit 210, an appropriate switching signal is transmitted.

Each switch is driven by a driving signal (not shown) sent from the switch driving means 4254. In this case, the switch driving means 4254 controls each switch in the manner described below. When the SMU 20 is used to measure the DUT 10, the switches 4258A to 4258C and the switches 4256A to 4256C are in the states shown in FIG. 8. That is, the switches 4258A and 4256A are closed and the switches 4258C and 4256C are opened. The switch 4258B is in a state such that two lines that link the switch 4258B and the switch 4258C are connected to the guard conductors of the connectors 4202 and 4203, and the switch 4256B is in a state such that two lines that link the switch 4256B and the switch 4256C are connected to the guard conductors of the connectors 4204 and 4205. At this point, the switch 102 (shown in FIG. 7) provided in the vicinity of the DUT 10 is open. This arrangement maintains Kelvin connection to the vicinity of the DUT 10 when the SMU 20 performs measurement (DC measurement). This enables higher accuracy measurement especially in minute resistance measurements.

When the CMU 22 performs measurement, the states of the switches 4258A to 4258C and 4256A to 4256C are opposite to the states illustrated. That is, the switch 4258A and the switch 4256A are opened and the switches 4258C and 4256C are closed. The switch 4258B is put into a state such that the guard conductors of the connectors 4202 and 4203 are connected to the shield conductors of the connectors 4268 and 4270 and the center conductor of the connector 4202 is connected to the center conductors of the connectors 4268 and 4270. The switch 4256B is put into a state such that the guard conductors of the connectors 4204 and 4205 are connected to the shield conductors of the connectors 4272 and 4274 and the center conductor of the connector 4204 is connected to the center conductors of the connectors 4272 and 4274. At this point, the switch 102 is closed. In this arrangement, when the CMU 22 performs measurement (AC measurement), the shield conductors of measurement connectors HC and HP (or a ground line for positive side measurement connectors) and the shield conductors of measurement connectors LC and LP (or a ground line for negative side measurement connectors) are extended without spoiling their insulation and are connected to each other in the □vicinity of DUT 10. This means that the AC current path of the AC measurement consists of a path in which the AC current passes from the center conductor of measurement connector HC of CMU 22, via the DUT 10, to the center conductor of measurement connector LC of CMU 22, and then, the AC current passes from the shield conductor of negative side measurement connector of CMU 22, via the switch 102 in the vicinity of DUT 10, to the shield conductor of positive side measurement connector of CMU 22. As a result, a higher accuracy measurement can be achieved by reducing the residual impedance, or specifically the mutual inductance and the stray capacitance of cables of TRIAX OUT 1-4 connecting apparatus 42 and DUT 10.

Some illustrative embodiments according to the present invention have been described in the above. It is apparent to those skilled in the art that various improvements can be made to the embodiments without substantially departing from the novel disclosure and advantages of the present invention. It is, therefore, intended that such improvements are also encompassed by the claims of the present invention.

What is claimed is:

1. A connection apparatus used for semiconductor-device characteristic measurement apparatuses, comprising: a switch for being connected to a device under test by a connection and receiving a switching signal from a controller, the device under test being a semiconductor device, wherein the connection is provided with a first guard and a second guard; a control-signal connector for receiving the switching signal from the controller and sending the switching signal to the switch; a plurality of first connectors for being connected to the switch and for being connected to a plurality of first measuring apparatus connectors included in a first measuring apparatus for measuring a first electrical characteristic of the device under test; a plurality of second connectors for being connected to the switch and for being connected to a plurality of second measuring apparatus connectors included in a second measuring apparatus for measuring a second electrical characteristic of the device under test; a guard switch having a first terminal connected to the first guard near the device under test and a second terminal connected to the second guard near the device under test; and a guard control-signal connector for receiving a guard switching signal from the controller and sending the guard switching signal to the guard switch; wherein the first measuring apparatus and the second measuring apparatus are connected to the device under test via respective different wiring configurations, and, in response to the switching signal sent from the controller via the control-signal connector, the switch determines which of the first or second connectors are electrically connected to the device under test, in accordance with the wiring configuration of the corresponding measuring apparatus.

2. The connection apparatus according to claim 1, wherein the connection apparatus is connected to a measurement unit in which the first measuring apparatus, the second measuring apparatus, and the controller are arranged in a fixed relationship relative to each other, and the first measuring apparatus connectors, the second measuring apparatus connectors, and a control-signal output connector of the controller are arranged in a predetermined arrangement, wherein the first connectors corresponding to the first measuring apparatus connectors, the second connectors corresponding to the second measuring apparatus connectors, and the control-signal connector corresponding to the control-signal output connector are integrally arranged according to the predetermined arrangement; and the connection apparatus is integrally connectable to the first measuring apparatus connectors, the second measuring apparatus connectors, and the control-signal output connector.

3. The connection apparatus according to claim 1, wherein the first measuring apparatus comprises a voltage-current characteristic measurement apparatus and the second measuring apparatus comprises an electrical capacitance measurement apparatus.

4. The connection apparatus according to claim 1, wherein the switch comprises reconfiguring means, controlled by the controller, for changing a combination of measurement signals output to at least two terminals connected to the device under test.

5. The connection apparatus according to claim 1, wherein the semiconductor-device characteristic measurement apparatus comprises inputting means, which has a first mode and a second mode, and a selection controller for receiving a selection input from the inputting means, wherein the selection controller controls the first measuring apparatus, the second measuring apparatus, and the switch so that, upon the selection of the first mode, the first measuring apparatus is connected to the device under test and is operated, and upon the selection of the second mode, the second measuring apparatus is connected to the device under test and is operated, and wherein when the device under test is one of a metal-oxide-semiconductor transistor device, a pair of wires, and a bipolar transistor, measurement of corresponding one of gate leakage evaluation of a metal-oxide-semiconductor gate oxide layer, inter-wire leakage evaluation, and electrical characteristic evaluation of the bipolar transistor is selected in the first mode, and measurement of corresponding one of layer-thickness evaluation of the metal-oxide-semiconductor gate oxide layer, inter-wire capacitance evaluation, and junction capacitance evaluation of the bipolar transistor is selected in the second mode.

6. The connection apparatus of claim 1, further comprising a chassis housing at least the switch, wherein the plurality of second connectors are electrically insulated from the chassis.

7. The connection apparatus according to claim 1, wherein the first measuring apparatus comprises a voltage-current characteristic measurement apparatus and the second measuring apparatus comprises an electrical capacitance measurement apparatus, and wherein the guard switch is opened when the first measuring apparatus is connected to the device under test and the guard switch is closed when the second measuring apparatus is connected to the device under test.

* * * * *